(12) United States Patent
Todaka et al.

(10) Patent No.: US 12,439,563 B2
(45) Date of Patent: Oct. 7, 2025

(54) WATER JACKET

(71) Applicant: HONDA MOTOR CO., LTD., Tokyo (JP)

(72) Inventors: Hirosumi Todaka, Saitama (JP); Yasunari Kimura, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 315 days.

(21) Appl. No.: 18/128,794

(22) Filed: Mar. 30, 2023

(65) Prior Publication Data

US 2023/0320043 A1    Oct. 5, 2023

(30) Foreign Application Priority Data

Mar. 31, 2022  (JP) ................. 2022-059134

(51) Int. Cl.
*H05K 7/20* (2006.01)
*B33Y 80/00* (2015.01)

(52) U.S. Cl.
CPC ..... *H05K 7/20445* (2013.01); *H05K 7/20409* (2013.01); *B33Y 80/00* (2014.12); *H05K 7/20927* (2013.01)

(58) Field of Classification Search
None
See application file for complete search history.

(56) References Cited

U.S. PATENT DOCUMENTS

| | | | | |
|---|---|---|---|---|
| 5,763,950 A | * | 6/1998 | Fujisaki | H01L 23/3672 |
| | | | | 257/E29.022 |
| 7,983,045 B2 | * | 7/2011 | Bhattacharya | G06F 1/20 |
| | | | | 416/97 R |
| 8,451,610 B2 | * | 5/2013 | Kharazmi | H01L 23/473 |
| | | | | 361/698 |

(Continued)

FOREIGN PATENT DOCUMENTS

JP         5975110 B2     8/2016
JP      2018-147997 A    9/2018

(Continued)

OTHER PUBLICATIONS

Jul. 1, 2025, Translation of Japanese Office Action issued for related JP Application No. 2022-059134.

*Primary Examiner* — Courtney L Smith
(74) *Attorney, Agent, or Firm* — Paratus Law Group, PLLC

(57) ABSTRACT

A water jacket includes a base having a plate shape. The base includes: a refrigerant supply path having a refrigerant inflow portion configured to allow a refrigerant to flow thereinto; a refrigerant discharge path having a refrigerant outflow portion configured to allow the refrigerant to flow out therethrough; and a chamber communicating with the refrigerant supply path and the refrigerant discharge path. The chamber includes: a first surface and a second surface facing the first surface; a plurality of columnar fins erected from the first surface and intersecting a flow direction of the refrigerant; and a plurality of wing-like fins disposed closer (Continued)

to the second surface than the first surface and inclined or curved from an upstream side toward a downstream side in the flow direction of the refrigerant as the plurality of wing-like fins go from the second surface toward the first surface.

4 Claims, 6 Drawing Sheets

(56) References Cited

U.S. PATENT DOCUMENTS

| | | | | |
|---|---|---|---|---|
| 9,657,997 | B2* | 5/2017 | Fujita | H05K 7/20436 |
| 9,980,415 | B2* | 5/2018 | Zhou | H05K 7/20927 |
| 10,433,457 | B2* | 10/2019 | Kobayashi | F28F 1/40 |
| 11,818,831 | B2* | 11/2023 | Karamavruc | H05K 1/0203 |
| 12,074,091 | B2* | 8/2024 | Koyama | H05K 7/20 |
| 12,255,117 | B2* | 3/2025 | Zuo | H01L 23/467 |
| 2006/0215715 | A1 | 9/2006 | Kouta et al. | |
| 2009/0114372 | A1* | 5/2009 | Ippoushi | F28F 3/12 |
| | | | | 165/104.19 |
| 2011/0067841 | A1* | 3/2011 | Doo | H05K 7/20254 |
| | | | | 165/104.19 |
| 2013/0228315 | A1* | 9/2013 | Kennedy | H01L 23/473 |
| | | | | 165/109.1 |
| 2015/0021756 | A1 | 1/2015 | Adachi | |
| 2020/0003497 | A1 | 1/2020 | Aston et al. | |
| 2020/0235030 | A1 | 7/2020 | Kim et al. | |
| 2021/0247140 | A1 | 8/2021 | Aston et al. | |
| 2022/0377939 | A1* | 11/2022 | Uchibe | H01L 23/473 |

FOREIGN PATENT DOCUMENTS

| | | |
|---|---|---|
| JP | 2020-025087 A | 2/2020 |
| JP | 6984778 B1 | 12/2021 |
| KR | 10-2020-0091240 A | 7/2020 |
| WO | WO 2004/076952 A1 | 9/2004 |

* cited by examiner

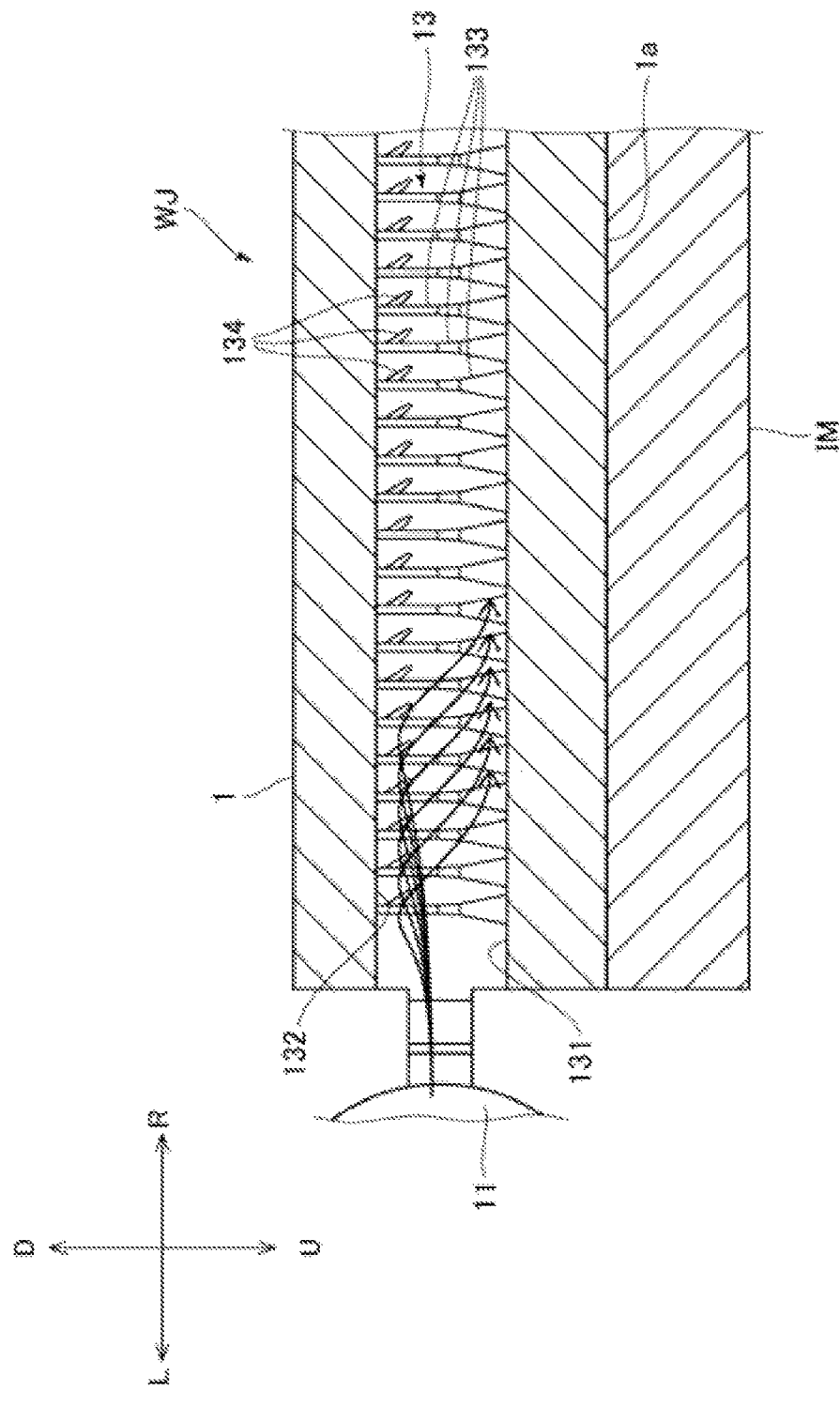

WATER JACKET

CROSS-REFERENCE TO RELATED APPLICATIONS

This application is based on and claims priority under 35 USC 119 from Japanese Patent Application No. 2022-059134 filed on Mar. 31, 2022, the entire content of which is incorporated herein by reference.

TECHNICAL FIELD

The present invention relates to a water jacket.

BACKGROUND ART

In the related art, research and development have been conducted to contribute to improvement in energy efficiency in order to allow more people to access reliable, sustainable and advanced energy.

For example, research and development related to electrification have been performed also in transportation equipment such as vehicles, aircrafts, and manned drones. When the transportation equipment is electrically driven, in addition to a power storage device such as a battery and a capacitor, and a rotary electric machine such as a motor and a generator, an inverter that converts DC power stored in the power storage device into AC power and supplies the AC power to the rotary electric machine is required. Since the inverter is a heat generating component, the inverter is generally cooled by a water jacket.

For example, in a semiconductor device of JP5975110B, it is described that a cylindrical or plate-like fin is provided in a chamber of a water jacket.

However, in the semiconductor device described in JP5975110B, heat exchange is performed between a refrigerant and the fin, but a flow of the refrigerant from a position far from a heating element to a portion near the heating element is not considered, and thus there is room for improvement.

An aspect of the present disclosure relates to provide a water jacket that can effectively cool a heat generating component by appropriately controlling a flow of a refrigerant.

SUMMARY OF INVENTION

According to an aspect of the present disclosure, there is provided a water jacket for cooling a heat generating component, the water jacket including a base having a plate shape. The base includes: a refrigerant supply path having a refrigerant inflow portion configured to allow a refrigerant to flow thereinto; a refrigerant discharge path having a refrigerant outflow portion configured to allow the refrigerant to flow out therethrough; and a chamber communicating with the refrigerant supply path and the refrigerant discharge path. The chamber includes: a first surface and a second surface facing the first surface, the first surface being on a side on which the heat generating component is disposed; a plurality of columnar fins erected from the first surface and intersecting a flow direction of the refrigerant; and a plurality of wing-like fins disposed closer to the second surface than the first surface and inclined or curved from an upstream side toward a downstream side in the flow direction of the refrigerant as the plurality of wing-like fins go from the second surface toward the first surface.

BRIEF DESCRIPTION OF DRAWINGS

FIG. 6 is a schematic view illustrating a flow rectification action of a refrigerant by the wing-like fins 134.

DESCRIPTION OF EMBODIMENTS

Figure 1:
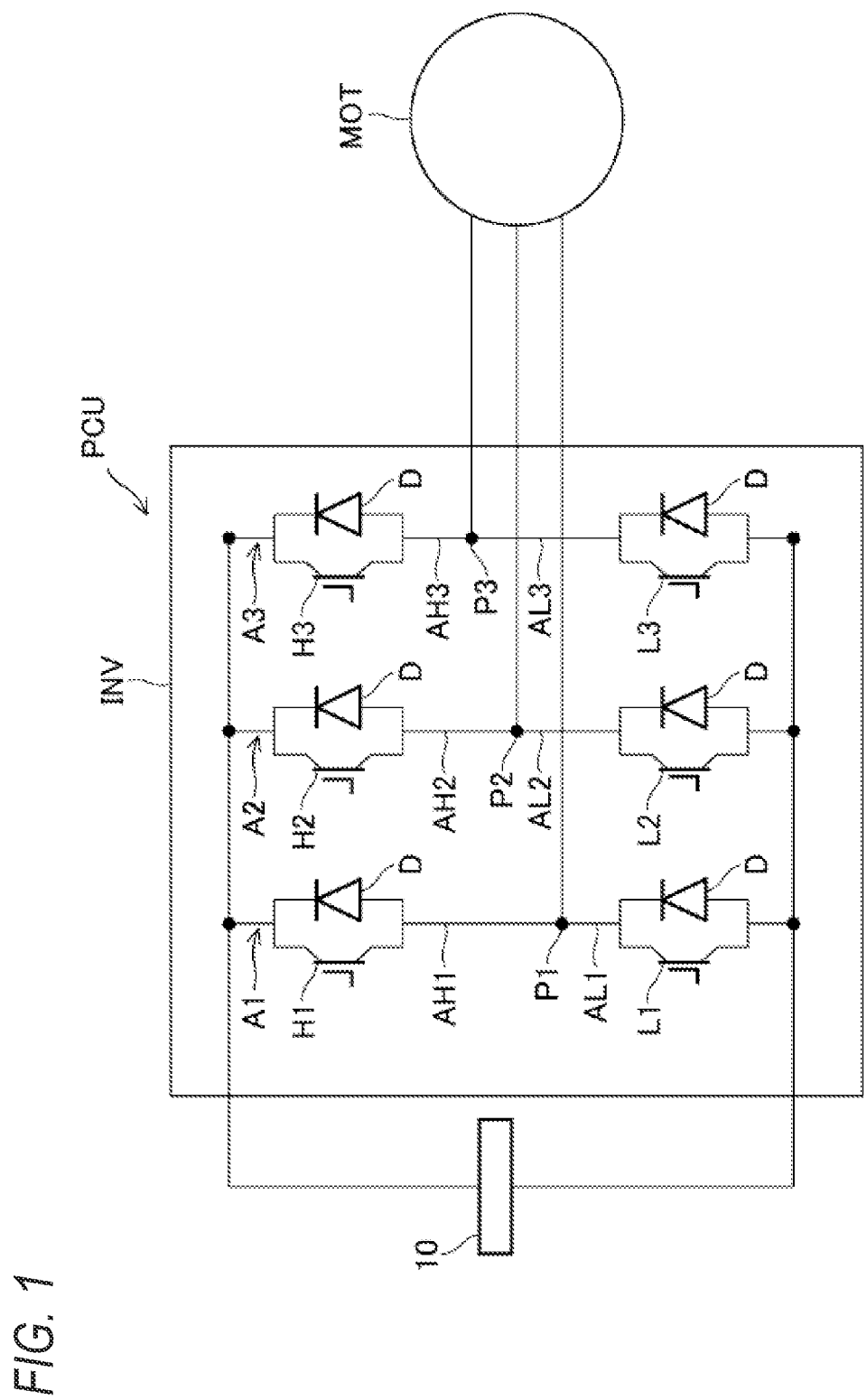
FIG. 1 is a diagram illustrating a configuration of a power control unit PCU connected to a motor MOT.

Hereinafter, an embodiment of the present invention will be described with reference to FIGS. 1 to 6. The drawings are to be viewed in the direction of reference signs, and in the following description, front, rear, left, right, and upper and lower directions are set for the sake of convenience. In the drawings, a front side is represented by Fr, a rear side is represented by Rr, a left side is represented by L, a right side is represented by R, an upper side is represented by U, and a lower side is represented by D.

A water jacket WJ according to an embodiment of the present invention is provided in, for example, a power control unit PCU for transportation equipment. As illustrated in FIG. 1, the power control unit PCU includes a power storage unit 10 and an inverter INV that converts electric power of the power storage unit 10 to drive a motor MOT. The power storage unit 10 is, for example, an electric double layer capacitor, a lithium ion battery, or a nickel hydrogen battery.

Inverter

Figure 2:
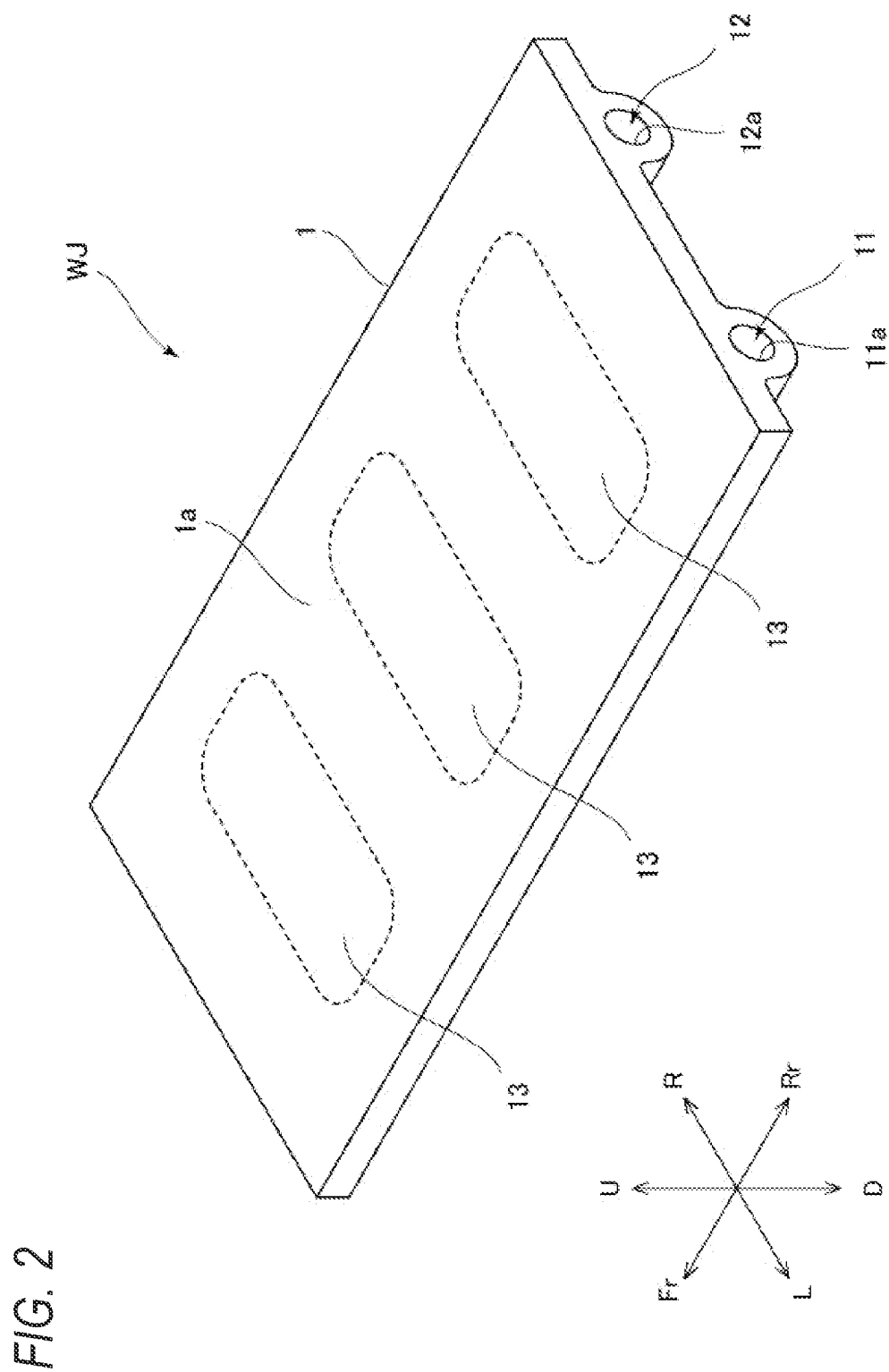
FIG. 2 is a perspective view illustrating a base 1 of a water jacket WJ.

As illustrated in FIG. 2, the inverter INV has a plurality of switching elements H1 to H3 and L1 to L3, and drives the motor MOT by switching control of the plurality of switching elements H1 to H3 and L1 to L3. Specifically, the inverter INV converts DC power output from the power storage unit 10 into AC power, and outputs the converted AC power to the motor MOT. The inverter INV converts AC power output from the motor MOT into DC power, and outputs the converted DC power to the power storage unit 10. The switching element is, for example, an insulated gate bipolar transistor (IGBT), a metal oxide semiconductor (MOS) transistor for electric power, a bipolar transistor for electric power, or the like.

More specifically, the inverter INV includes first to third arms A1 to A3 connected in parallel to the power storage unit 10. The first arm A1 includes an upper arm AH1 in which the switching element H1 and a freewheel diode D are provided in parallel, and a lower arm AL1 in which the switching element L1 and the freewheel diode D are provided in parallel and that is connected in series to the upper arm AH1 via a midpoint P1. The second arm A2 includes an upper arm AH2 in which the switching element H2 and the freewheel diode D are provided in parallel, and a lower arm AL2 in which the switching element L2 and the freewheel diode D are provided in parallel and that is connected in series to the upper arm AH2 via a midpoint P2. The third arm A3 includes an upper arm AH3 in which the switching element H3 and the freewheel diode D are provided in parallel, and a lower arm AL3 in which the switching element L3 and the freewheel diode D are provided in parallel and that is connected in series to the upper arm AH3 via a midpoint P3. The midpoints P1 to P3 of the first to third arms A1 to A3 are connected to the three-phase coils of the motor MOT.

Inverter Module

The inverter INV includes, for example, three inverter modules IM (see FIG. 5) for U-phase constituting the first arm A1, for V-phase constituting the second arm A2, and for W-phase constituting the third arm A3. Each inverter module IM is a heat generating component having a rectangular thin plate shape. In the present embodiment, the three inverter modules IM are arranged at predetermined intervals in a front-rear direction.

Water Jacket

The water jacket WJ is disposed so as to be in contact with the inverter module IM, thereby cooling the inverter module IM.

Base

Figure 3:
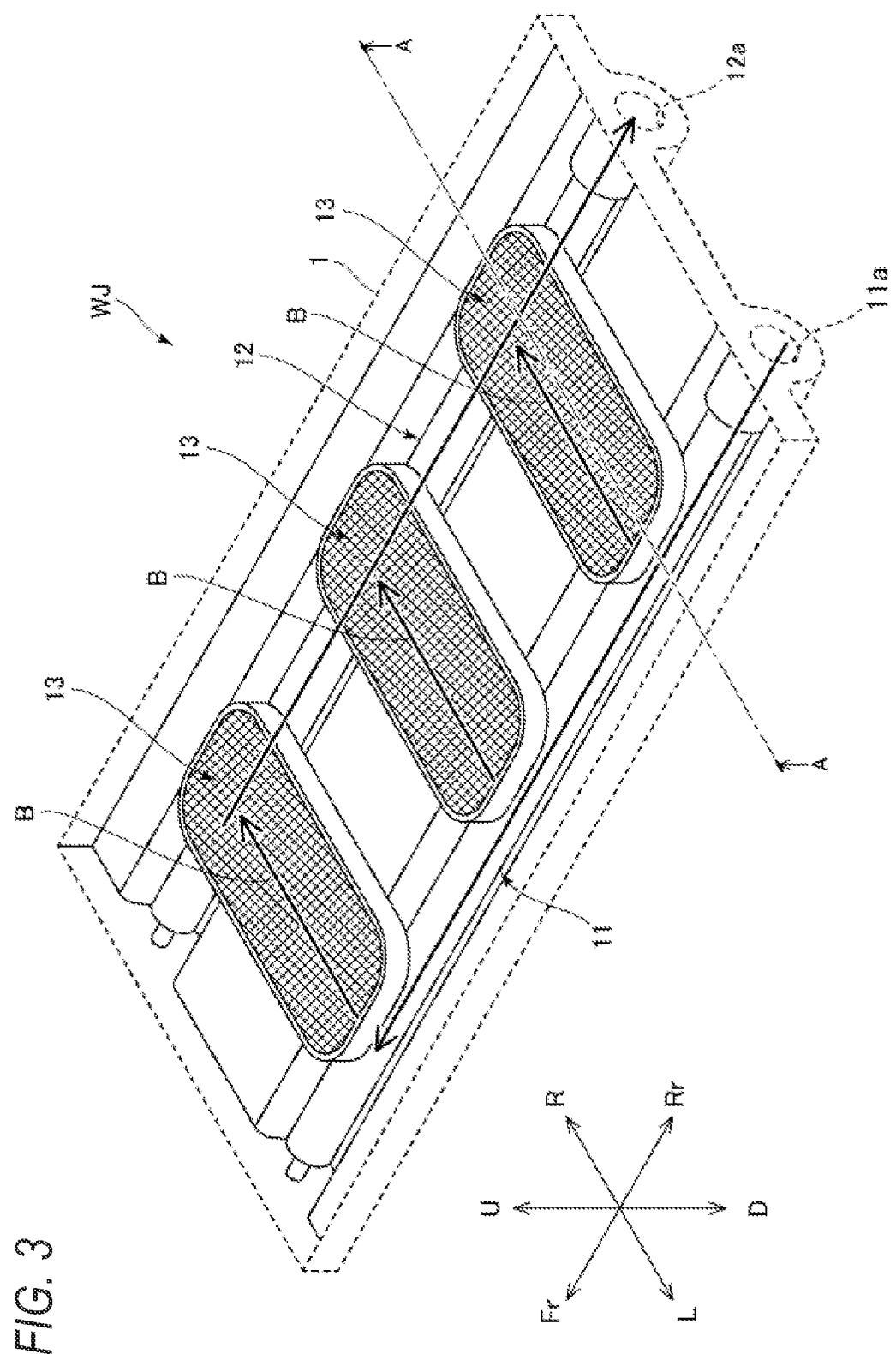
FIG. 3 is a perspective view of the base 1 illustrating a flow of a refrigerant inside the base 1.

As illustrated in FIGS. 2 and 3, the water jacket WJ includes a base 1, the base 1 has a plate shape having a flat cooling surface 1a, and the inverter module IM is disposed on the cooling surface 1a. The base 1 includes a refrigerant supply path 11 having a refrigerant inflow portion 11a into which a refrigerant flows, a refrigerant discharge path 12 having a refrigerant outflow portion 12a from which the refrigerant flows out, and a plurality of chambers 13 communicating with the refrigerant supply path 11 and the refrigerant discharge path 12. The plurality of chambers 13 cool the inverter module IM by performing heat exchange between the inverter module IM disposed along the cooling surface 1a and the refrigerant.

As illustrated in FIG. 3, the refrigerant supply path 11 is formed along a longitudinal direction (front-rear direction) of the base 1 and at one end side (left side) in a transverse direction of the base 1, and the refrigerant discharge path 12 is formed along the longitudinal direction of the base 1 and at the other end side (right side) in the transverse direction of the base 1. Further, the plurality of chambers 13 are formed between the refrigerant supply path 11 and the refrigerant discharge path 12 so as to extend along the transverse direction (left-right direction) of the base 1 and to be arranged in parallel at predetermined intervals in the longitudinal direction of the base 1, and communicate with both the refrigerant supply path 11 and the refrigerant discharge path 12. The plurality of chambers 13 are provided at positions corresponding to the three inverter modules IM. According to such a base 1, since the refrigerant flowing into the refrigerant inflow portion 11a passes through the refrigerant supply path 11 along the longitudinal direction of the base 1 and then flows into the plurality of chambers 13 along the transverse direction of the base 1, it is possible to appropriately prevent temperature gradient or a variation in temperature that is likely to occur in the longitudinal direction of the base 1 (the inverter module IM).

Chamber

Figure 4:
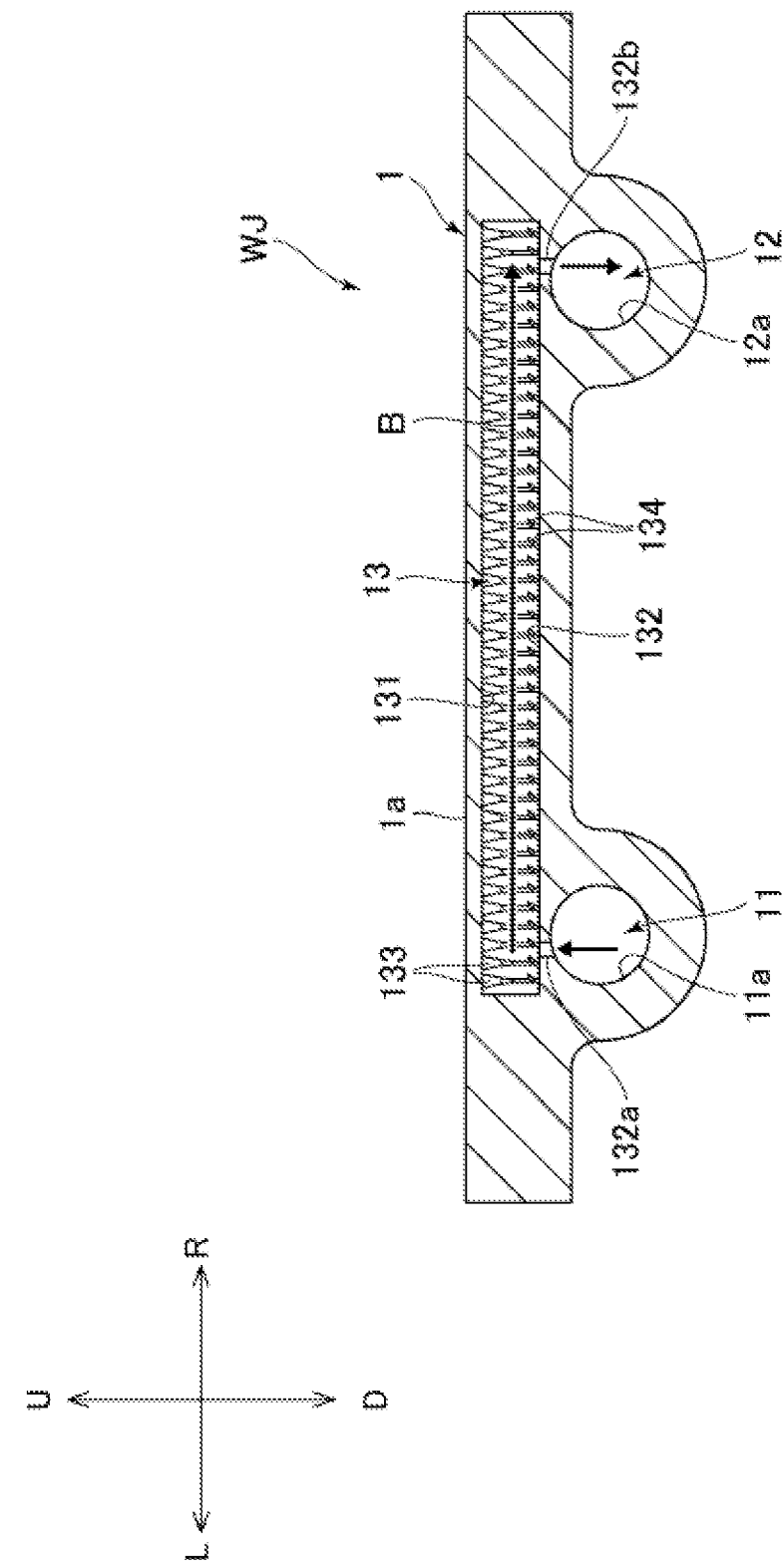
FIG. 4 is a cross-sectional view taken along a line A-A of FIG. 3.

As illustrated in FIG. 4, the chamber 13 is a space formed between a first surface 131 and a second surface 132 facing each other. The first surface 131 and the second surface 132 are parallel to the cooling surface 1a, and among the first surface 131 and the second surface 132, a surface disposed on a side closer to the cooling surface 1a is the first surface 131. One end side of the chamber 13 communicates with the refrigerant supply path 11 via an inflow-side communication port 132a formed on the second surface 132 side, and the other end side of the chamber 13 communicates with the refrigerant discharge path 12 via an outflow-side communication port 132b formed on the second surface 132 side.

Columnar Fin and Wing-Like Fin

Figure 5:
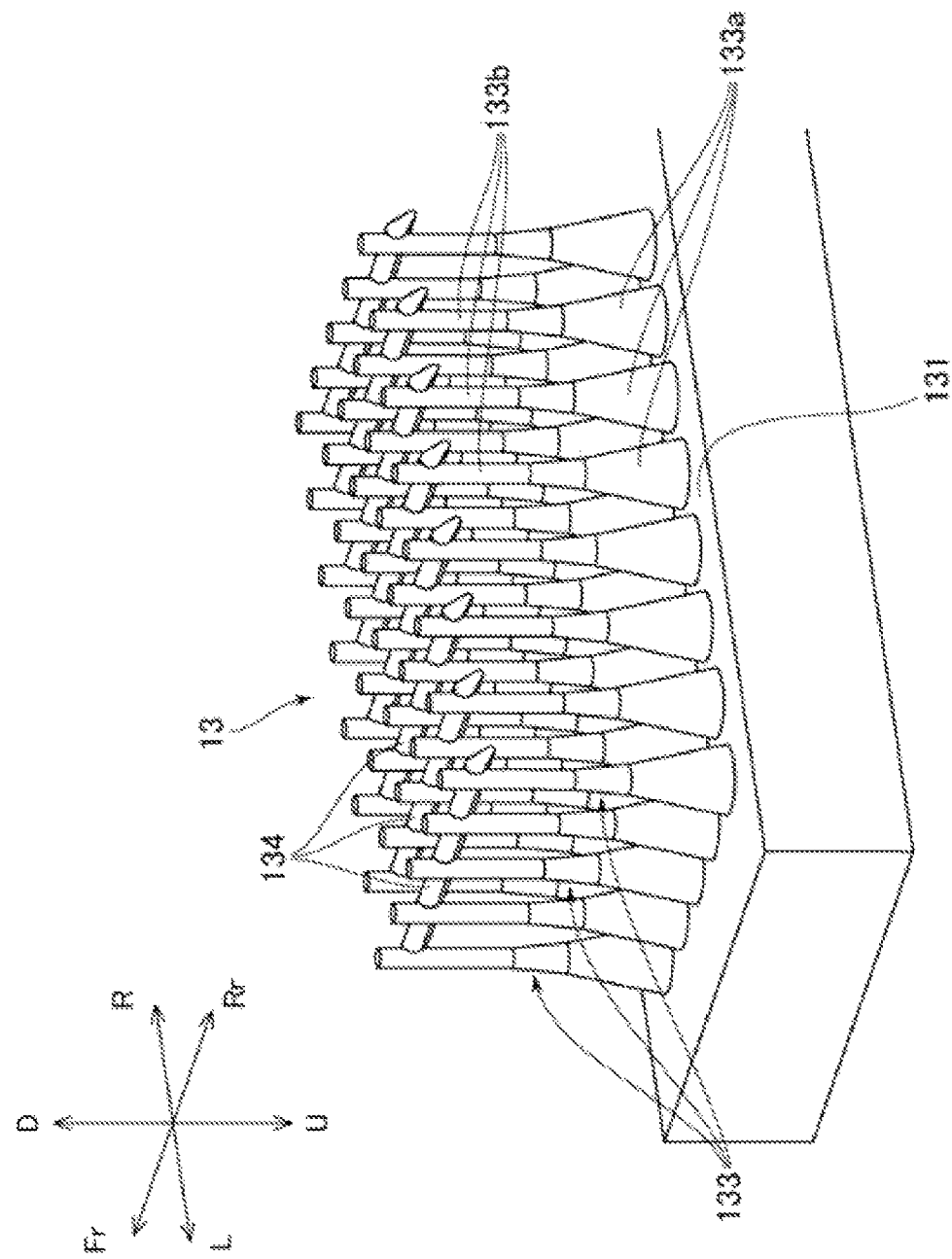
FIG. 5 is a perspective view illustrating columnar fins 133 and wing-like fins 134 in a chamber 13.

As illustrated in FIGS. 4 and 5, the chamber 13 is provided with a plurality of columnar fins 133 and a plurality of wing-like fins 134. The plurality of columnar fins 133 are erected from the first surface 131 and are substantially orthogonal to a flow direction B of the refrigerant (see FIGS. 3 and 4). For example, a total of N×M columnar fins 133 are provided in the chamber 13 so that N columnar fins 133 are arranged at predetermined intervals in the flow direction B of the refrigerant and M columnar fins 133 are arranged in a width direction substantially orthogonal to the flow direction B of the refrigerant and a height direction of the columnar fins 133. According to such a configuration, the plurality of columnar fins 133 are cooled by the refrigerant while the refrigerant flows from an upstream side to a downstream side of the chamber 13 through the plurality of columnar fins 133, so that the inverter module IM is cooled via the first surface 131 and the cooling surface 1a. The columnar fins 133 are not necessarily orthogonal to the flow direction B of the refrigerant (see FIG. 4), and may intersect with the flow direction B of the refrigerant (see FIG. 4).

As illustrated in FIG. 4, it is desirable that the plurality of columnar fins 133 are erected from the first surface 131, and a tip end side is integrally connected to the second surface 132. In this way, the columnar fins 133 are supported at both ends by the first surface 131 and the second surface 132 of the chamber 13, so that support strength of the columnar fins 133 can be increased.

As illustrated in FIG. 5, it is desirable that a cross-sectional area of the columnar fin 133 on the first surface 131 side is larger than a cross-sectional area of the columnar fin 133 on the second surface 132 side. In this way, by increasing the cross-sectional area of the columnar fin 133 on the side closer to the inverter module IM, it is possible to actively perform heat exchange on the first surface 131 side rather than on the second surface 132 side, and to more appropriately cool the inverter module IM.

Specifically, the columnar fin 133 of the present embodiment includes a conical portion 133a that is located on the first surface 131 side and has a cross-sectional area that decreases toward the second surface 132 side, and a columnar portion 133b that extends from a tip end of the conical portion 133a toward the second surface 132 side with the same cross-sectional area. Accordingly, heat exchange with the refrigerant can be actively performed at a root portion of the conical portion 133a of the columnar fin 133 on the side closer to the inverter module IM. In addition, by reducing the cross-sectional area of the columnar fin 133 at the columnar portion 133b and the tip end portion of the conical portion 133a of the columnar fin 133, it is possible to prevent the flow of the refrigerant from being hindered by the columnar fin 133.

As illustrated in FIGS. 4 to 6, the plurality of wing-like fins 134 are disposed on the second surface 132 side, and are inclined or curved from the second surface 132 toward the first surface 131 from the upstream side toward the downstream side in the flow direction B of the refrigerant. According to such wing-like fins 134, as illustrated in FIG. 6, since a large amount of refrigerant can be guided to the first surface 131 side closer to the inverter module IM, the inverter module IM can be more appropriately cooled. Although FIG. 6 is different from a structure illustrated in FIG. 4 and the like in that the inflow-side communication port 132a is arranged along the flow direction B of the refrigerant flowing through the chamber 13, the action of the wing-like fins 134 is the same.

As illustrated in FIG. 5, it is desirable that the wing-like fin 134 is formed over the plurality of columnar fins 133 arranged side by side in the width direction orthogonal to the flow direction B of the refrigerant and the height direction of the columnar fins 133. In this way, the wing-like fin 134 can be integrally formed with the plurality of columnar fins 133, and the rigidity of the wing-like fin 134 can be increased. In addition, as compared with a case where the wing-like fins 134 are integrally formed with the second surface 132, a contact area of the refrigerant with respect to the wing-like fin 134 can be increased, and more refrigerant can be guided to the first surface 131 side closer to the inverter module IM.

It is desirable that the base 1 is integrally formed by metal additive manufacturing using a powder metal, that is, 3D print additive manufacturing. The metal additive manufacturing is a known forming technique of the related art in which a metal powder is melted by an electron beam or a fiber laser and is laminated and solidified to manufacture a metal component, and is a technique in which a metal member having a three-dimensionally complicated shape can be formed and a fine and dense 3D shape can be formed. In this way, it is possible to realize a complicated fin shape in the chamber 13, which has not been realized by casting.

Although various embodiments have been described above with reference to the drawings, it is needless to say that the present invention is not limited to these examples. It is apparent that those skilled in the art can conceive of various modifications and changes within the scope described in the claims, and it is understood that such modifications and changes naturally fall within the technical scope of the present invention. In addition, respective constituent elements in the above embodiment may be freely combined without departing from the gist of the invention.

In the present specification, at least the following matters are described. Note that the corresponding constituent elements and the like in the above embodiment are shown in parentheses, but the present invention is not limited thereto.

(1) A water jacket (water jacket WJ) for cooling a heat generating component (inverter module IM), the water jacket including
   a base (base 1) having a plate shape,
   in which the base includes:
      a refrigerant supply path (refrigerant supply path 11) having a refrigerant inflow portion (refrigerant inflow portion 11a) configured to allow a refrigerant to flow thereinto;
      a refrigerant discharge path (refrigerant discharge path 12) having a refrigerant outflow portion (refrigerant outflow portion 12a) configured to allow the refrigerant to flow out therethrough; and
      a chamber (chamber 13) communicating with the refrigerant supply path and the refrigerant discharge path, and
   in which the chamber includes:
      a first surface (first surface 131) and a second surface (second surface 132) facing the first surface, the first surface being on a side on which the heat generating component is disposed;
      a plurality of columnar fins (columnar fins 133) erected from the first surface (first surface 131) and intersecting a flow direction of the refrigerant; and
      a plurality of wing-like fins (wing-like fins 134) disposed closer to the second surface (second surface 132) than the first surface and inclined or curved from the second surface toward the first surface as the plurality of wing-like fins go from an upstream side toward a downstream side in the flow direction of the refrigerant.

According to (1), the columnar fins are cooled while the refrigerant flows from the upstream side to the downstream side of the chamber through the plurality of columnar fins, whereby the heat generating component is cooled. In addition, since the chamber is provided with the plurality of wing-like fins, which are inclined or curved from the second surface toward the first surface as the plurality of wing-like fins go from the upstream side toward the downstream side in the flow direction of the refrigerant, on the second surface side far from the heat generating component, a large amount of the refrigerant can be guided to the side closer to the heat generating component, and the heat generating component can be more appropriately cooled.

(2) The water jacket according to (1),
   in which each of the plurality of wing-like fins is formed over columnar fins out of the plurality of columnar fins, the columnar fins being arranged side by side in a width direction orthogonal to the flow direction of the refrigerant.

According to (2), the wing-like fin can be integrally formed with the plurality of columnar fins, and the rigidity of the wing-like fin can be increased.

(3) The water jacket according to (1) or (2),
   in which a cross-sectional area of each of the plurality of columnar fins on a first surface side is larger than that on a second surface side.

According to (3), by increasing the cross-sectional area of the columnar fin on the side closer to the heat generating component, the heat generating component can be more appropriately cooled.

(4) The water jacket according to any one of (1) to (3),
   in which each of the plurality of columnar fins includes:
      a conical portion (conical portion 133a) located on a first surface side and having a cross-sectional area that decreases toward a second surface side; and
      a columnar portion (columnar portion 133b) extending from a tip end of the conical portion toward the second surface side with a constant cross-sectional area.

According to (4), since the columnar fin on the side closer to the heat generating component has a conical shape, heat exchange with the refrigerant can be actively performed at a root portion of the conical portion. In addition, it is possible to prevent the flow of the refrigerant from being hindered at the columnar portion and a tip end portion of the conical portion of the columnar fin.

(5) The water jacket according to any one of (1) to (4),
   in which the base is formed as one piece by 3D print additive manufacturing using powder metal.

According to (5), since the base is formed as one piece by the 3D print additive manufacturing using powder metal, it is possible to realize a complicated fin shape in the chamber which has not been realized by casting.

What is claimed is:

1. A water jacket for cooling a heat generating component, the water jacket comprising
   a base having a plate shape,
   wherein the base includes:
      a refrigerant supply path having a refrigerant inflow portion configured to allow a refrigerant to flow thereinto;
      a refrigerant discharge path having a refrigerant outflow portion configured to allow the refrigerant to flow out therethrough; and a chamber communicating with the refrigerant supply path and the refrigerant discharge path, and wherein the chamber includes:
  a first wall and a second wall, the first wall having a first interior surface and a first exterior surface opposite to the first interior surface, the second wall having a second interior surface facing the first interior surface, the heat generating component being disposed on the first exterior surface;
  a plurality of columnar fins erected from the first interior surface and intersecting a flow direction of the refrigerant; and
  a plurality of wing-like fins disposed closer to the second interior surface than the first interior surface and inclined or curved from the second interior surface toward the first interior surface as the plurality of wing-like fins go from an upstream side toward a downstream side in the flow direction of the refrigerant, and wherein each of the plurality of wing-like fins is formed over columnar fins out of the plurality of columnar fins, the columnar fins being arranged side by side in a width direction orthogonal to the flow direction of the refrigerant.

2. The water jacket according to claim 1, wherein each of the plurality of columnar fins includes a first end portion adjacent to the first interior surface and a second end portion adjacent to the second interior surface, and a cross-sectional area of the first end portion is larger than that of the second end portion.

3. The water jacket according to claim 1, wherein each of the plurality of columnar fins includes:
  a conical portion adjacent to the first interior surface and having a cross-sectional area that decreases toward the second interior surface; and
  a columnar portion extending from a tip end of the conical portion toward the second interior surface with a constant cross-sectional area.

4. The water jacket according to claim 1, wherein the base is formed as one piece by 3D print additive manufacturing using powder metal.

* * * * *